(12) United States Patent
Sato et al.

(10) Patent No.: US 6,570,380 B2
(45) Date of Patent: May 27, 2003

(54) NON-LINEAR HALL IC

(75) Inventors: Takashi Sato, Shizuoka-ken (JP); Masaki Hirota, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/827,243

(22) Filed: Apr. 6, 2001

(65) Prior Publication Data

US 2001/0048304 A1 Dec. 6, 2001

(30) Foreign Application Priority Data

Apr. 7, 2000 (JP) .................................. 2000-106767

(51) Int. Cl.⁷ .................... G01R 33/07; G01R 33/02
(52) U.S. Cl. ............... 324/251; 324/207.2; 338/32 H; 327/511
(58) Field of Search .............. 324/207.2, 251, 324/260, 132; 327/511; 338/32 H; 73/313

(56) References Cited

U.S. PATENT DOCUMENTS

| | | | | |
|---|---|---|---|---|
| 3,852,802 A | * | 12/1974 | Wolf et al. | 148/DIG. 102 |
| 3,891,902 A | * | 6/1975 | Konrad | 318/139 |
| 4,088,952 A | * | 5/1978 | Sikora | 324/207.17 |
| 4,873,655 A | * | 10/1989 | Kondraske | 702/86 |
| 5,084,674 A | * | 1/1992 | Lachmann et al. | 324/166 |
| 5,192,877 A | * | 3/1993 | Bittebierre et al. | 324/207.2 |
| 5,636,548 A | * | 6/1997 | Dunn et al. | 73/313 |
| 5,850,142 A | * | 12/1998 | Rountos et al. | 324/207.2 |
| 6,329,817 B1 | * | 12/2001 | Moginine Gummer et al. | 324/251 |
| 6,340,884 B1 | * | 1/2002 | Wolf et al. | 324/207.21 |

* cited by examiner

Primary Examiner—Edward Lefkowitz
Assistant Examiner—Darrell Kinder
(74) Attorney, Agent, or Firm—Finnegan, Henderson, Farabow, Garrett & Dunner, L.L.P.

(57) ABSTRACT

A non-linear Hall IC that stores conversion information for converting Hall voltage output from a Hall element, and converts the Hall voltage into an output voltage based on the conversion information stored. The Hall voltage is converted into the output voltage such that a relation between the magnetic field strength and the output voltage becomes a non-linear relation.

4 Claims, 3 Drawing Sheets

NON-LINEAR HALL IC

BACKGROUND OF THE INVENTION

1. Field of the Invention

The present invention relates to a non-linear Hall IC for outputting voltage in accordance with a magnetic field strength, and more particularly, to a non-linear Hall IC having non-linear output characteristics.

2. Description of the Related Art

A Hall element is a semiconductor device for outputting voltage that is proportion to a magnetic field strength. A Hall IC comprising the Hall element combined with an amplifier circuit or correcting circuit has conventionally become commercially practical.

However, since the conventional Hall IC is formed for the sake of bringing the magnetic field strength and the output voltage into precise proportion to each other, although the conventional Hall IC is effective for measuring the magnetic field strength, it is necessary to prepare a calculating circuit for converting the output voltage into a desired value outside the Hall IC when it is unnecessary to bring the magnetic field strength and the output voltage into proportion to each other. Therefore, there are problems that an entire apparatus can not be reduced in size and costs thereof are increased.

For example, a shape of a fuel tank of an automobile is complicated and thus, a liquid level of fuel and an amount of fuel are not proportional to each other. Therefore, if an attempt is made to measure the amount of fuel by designating the displacement of liquid level with variation of magnetic field strength, and by measuring the magnetic field strength using the conventional linear Hall IC, although the liquid level can be measured precisely, the amount of fuel can not be measured precisely. Therefore, in the conventional Hall element, the calculating circuit is separately provided outside of the Hall IC to convert the output voltage of the Hall IC and to calculate the amount of fuel.

Since the calculating circuit is separately provided outside of the Hall IC in this manner, the Hall IC can not be reduced in size and costs thereof are increased.

SUMMARY OF THE INVENTION

The present invention has been accomplished in view of the above circumstances, and it is an object of the invention to provide a non-linear Hall IC capable of outputting arbitrary necessary output voltage to magnetic field strength.

To achieve the above object, according to a first aspect of the invention, there is provided a non-linear Hall IC for detecting a magnetic field strength using a Hall element to convert a Hall voltage outputted by the Hall element and output an output voltage, comprising storing means for storing conversion information for converting the Hall voltage outputted by the Hall element into the output voltage, and non-linear conversion means for converting the Hall voltage on a basis of the conversion information stored in the storing means thereby to establish a non-linear relation between the magnetic field strength and the output voltage.

According to the first aspect, it is possible to output arbitrary output voltage required for the magnetic field strength.

Therefore, if this non-linear Hall IC is utilized in a structure requiring non-linear characteristics such as the fuel tank for the automobile, since it is unnecessary to separately provide the calculation circuit, the entire apparatus can be reduced in size, and costs thereof can be reduced.

According to a second aspect of the invention, the conversion information stored in the storing means includes a plurality of sections of the magnetic field strength divided by arbitrary distances and the non-linear conversion means judges which of the sections the magnetic field strength corresponding to the Hall voltage does belong to and further converts the Hall voltage into the output voltage in each of the sections.

According to the second aspect, if this non-linear Hall IC is utilized in a structure requiring that characteristics are varied in each of arbitrary sections, since it is unnecessary to separately provide the calculation circuit, the entire apparatus can be reduced in size, and costs thereof can be reduced.

According to a third aspect of the invention, the conversion information stored in the storing means includes a plurality of sections of the magnetic field strength divided by constant distances and the non-linear conversion means judges which of the sections the magnetic field strength corresponding to the Hall voltage does belong to and further converts the Hall voltage into the output voltage in each of the sections.

According to the third aspect, if this non-linear Hall IC is utilized in a structure requiring that characteristics are varied in each of constant sections, since it is unnecessary to separately provide the calculation circuit, the entire apparatus can be reduced in size, and costs thereof can be reduced.

According to a fourth aspect of the invention, the non-linear conversion means establishes a curved relation between the magnetic field strength and the output voltage.

According to the fourth aspect, if this non-linear Hall IC is utilized in a structure in which characteristics are varied continuously, since it is unnecessary to separately provide the calculation circuit, the entire apparatus can be reduced in size, and costs thereof can be reduced.

DESCRIPTION OF THE PREFERRED EMBODIMENT

A structure of a non-linear Hall IC of an embodiment will be explained based on FIG. 1.

Figure 1:
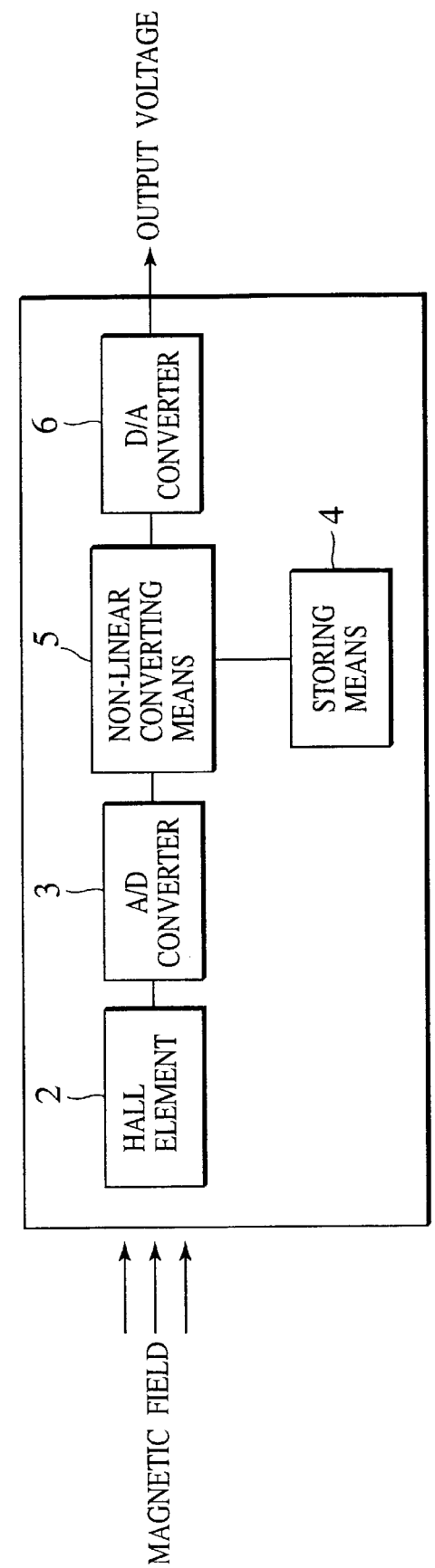
FIG. 1 is a block diagram showing a structure of an embodiment of a non-linear Hall IC of the present invention.

As shown in FIG. 1, a non-linear Hall IC 1 of this embodiment comprises a Hall element 2 for outputting Hall voltage suitable for magnetic field strength, an A/D converter 3 for converting the Hall voltage output from the Hall element 2 from an analogue value to a digital value, storing means 4 for storing conversion information for converting the digital value of the Hall voltage converted by the A/D converter 3 into a non-linear value, a non-linear converting means 5 for converting the digital value of the Hall voltage into the non-linear value as output voltage based on the conversion information stored in the storing means 4, and a D/A converter 6 for converting a digital value of the output voltage converted by the non-linear converting means 5 into an analogue value and for outputting the same.

In this non-linear Hall IC 1, the non-linear converting means 5 is constituted by a DSP (Digital Signal Processing), a microcomputer and the like, and the storing means 4 is constituted by a memory such as an EEPROM.

The conversion processing of the Hall voltage in the non-linear Hall IC 1 of this embodiment will be explained next.

The Hall element 2 detects a magnetic field and outputs Hall voltage suitable for the magnetic field. Then, the A/D converter 3 converts this Hall voltage from an analogue value into a digital value.

The non-linear converting means 5 converts the Hall voltage into non-linear output voltage based on the conversion information stored in the storing means 4.

Figure 2:
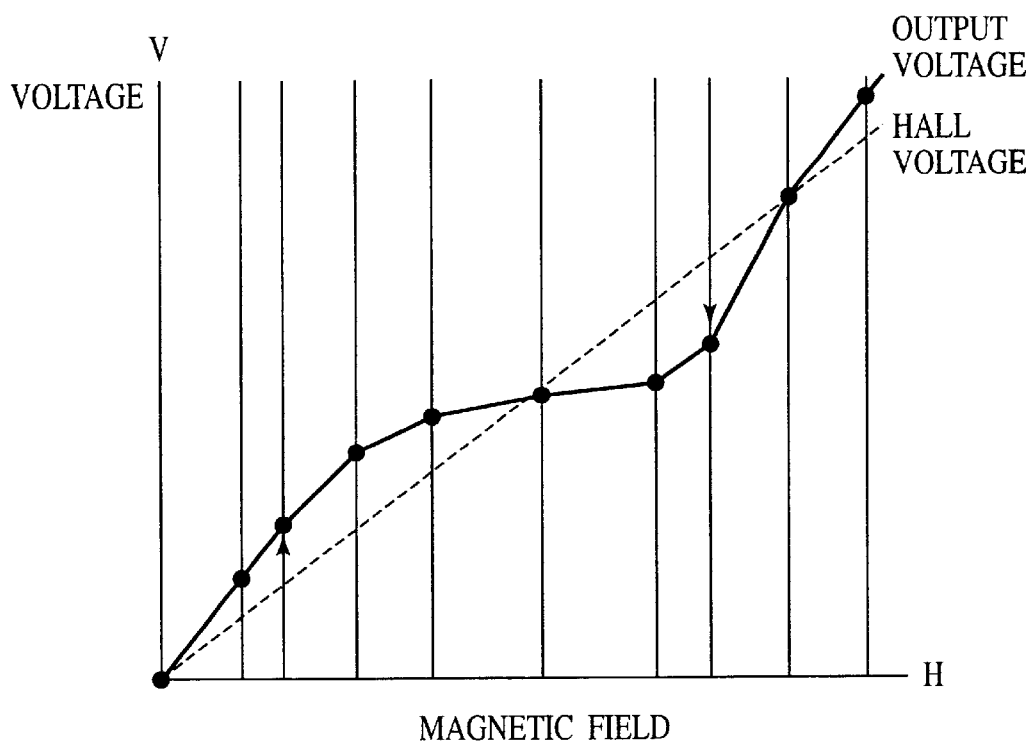
FIG. 2 is a graph showing output characteristics of a non-linear Hall IC 1 shown in FIG. 1, and showing the output characteristics when a magnetic field is divided into arbitrary sections.

As shown in FIG. 2 for example, the magnetic field strength is divided into arbitrary sections, and in each section, Hall voltage shown with a dotted line is converted into the output voltage shown with a solid line. In the sections in FIG. 2, each of the sections is interpolated by a separate straight line.

In this case, the magnetic field strength is divided into the arbitrary sections, and in each section, the following equation (1) is set and stored in the storing means 4:

$$H = a \times Vh \qquad (1)$$

(Vh: Hall voltage, H: magnetic field strength and a: arbitrary constant).

If the Hall voltage is input to the non-linear converting means 5, the magnetic field strength is calculated based on the equation (1) from the Hall voltage, and the concerned section is judged.

Further, in each of the sections, the following equation (2) is set and stored in the storing means 4:

$$V = b \times Vh + c \qquad (2)$$

(V: output voltage, b and c: arbitrary constants). Based on this equation (2), the output voltage V is calculated from the Hall voltage Vh. By converting the linear Hall voltage output from the Hall element 2 by the equation set in each section in this manner, the non-linear output voltage shown in FIG. 2 can be output.

If the non-linear Hall IC capable of outputting the non-linear output voltage to a fuel tank of an automobile, the magnetic field strength can be separately set in correspondence with variation of a shape of the fuel tank, so that the amount of fuel can be indicated precisely by the output voltage of the non-linear Hall IC.

Therefore, it is unnecessary to separately provide a calculating circuit outside the Hall IC.

Figure 3:
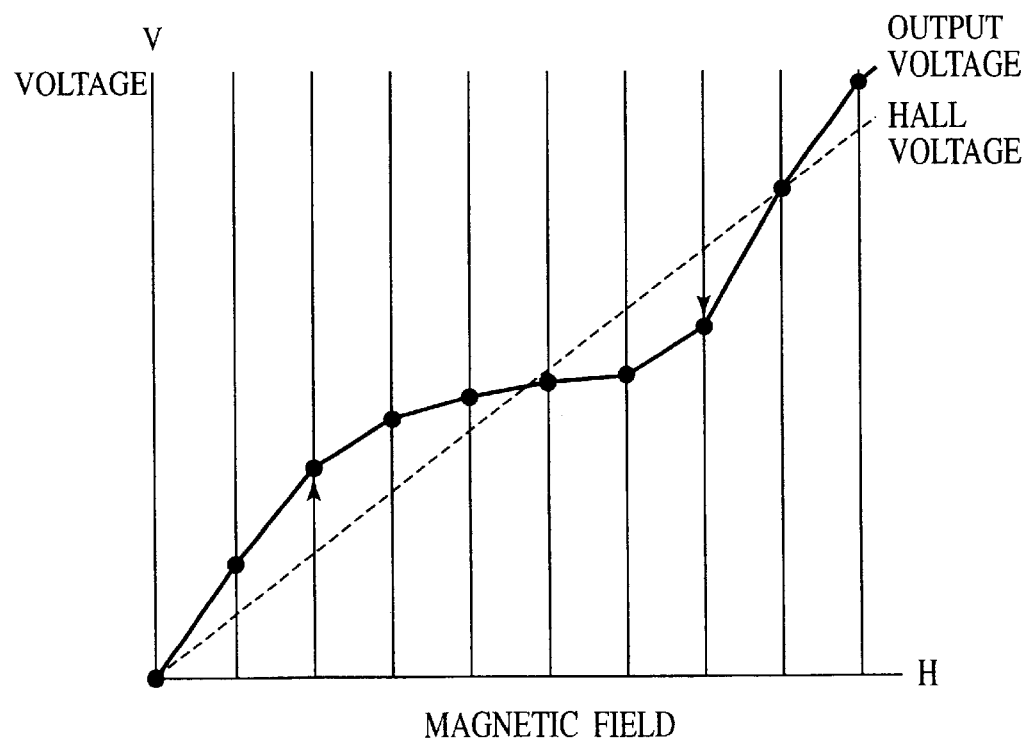
FIG. 3 is a graph showing output characteristics of a non-linear Hall IC 1 shown in FIG. 1, and showing the output characteristics when a magnetic field is divided into constant sections.

Although the magnetic field strength is divided through arbitrary distances in FIG. 2, the magnetic field strength may be divided through equal distances as shown in FIG. 3.

Figure 4:
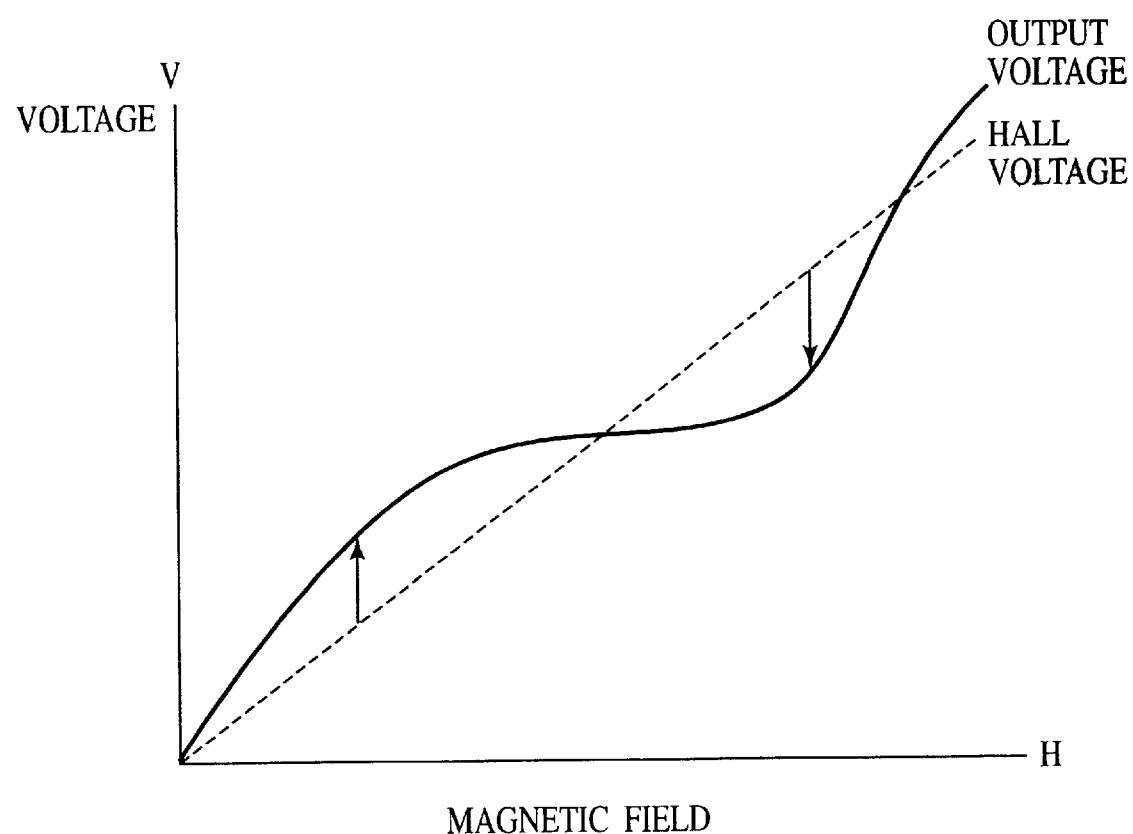
FIG. 4 is a graph showing output characteristics of a non-linear Hall IC 1 shown in FIG. 1, and showing the output characteristics when Hall voltage is converted by a curve.

Further, the Hall voltage may be converted into output voltage indicated with three-dimensional curve as shown in FIG. 4 or other curves. This design is advantageous when an amount of fuel is measured by a fuel tank whose shape is continuously varied.

If the Hall voltage was converted into non-linear output voltage by the non-linear converting means 5, the D/A converter 6 converts a digital value into an analogue value, and the output voltage of analogue value is output.

In this manner, in the non-linear converting means 5, the Hall voltage is converted into the non-linear output voltage based on the conversion information such as calculation equations stored in the storing means 4, and a required arbitrary output voltage can be obtained with respect to the magnetic field strength.

If this non-linear Hall IC is utilized in a structure requiring non-linear characteristics such as the fuel tank for the automobile, since it is unnecessary to separately provide the calculation circuit, the entire apparatus can be reduced in size, and costs thereof can be reduced.

What is claimed is:

1. A non-linear Hall IC for detecting a magnetic field strength using a Hall element to convert a Hall voltage outputted by the Hall element and output an output voltage, comprising:

storing means for storing conversion information for converting a Hall voltage outputted by a Hall element into an output voltage; and non-linear conversion means for converting the Hall voltage on a basis of a non-linear algorithm stored in the storing means thereby to establish a non-linear relation between a magnetic field strength and the output voltage.

2. The non-linear Hall IC according to claim 1, wherein the conversion information stored in the storing means includes a plurality of sections of the magnetic field strength divided by arbitrary distances and the non-linear conversion means judges which of the sections the magnetic field strength corresponding to the Hall voltage does belong to and further converts the Hall voltage into the output voltage in each of the sections.

3. The non-linear Hall IC according to claim 1, wherein the conversion information stored in the storing means includes a plurality of sections of the magnetic field strength divided by constant distances and the non-linear conversion means judges which of the sections the magnetic field strength corresponding to the Hall voltage does belong to and further converts the Hall voltage into the output voltage in each of the sections.

4. The non-linear Hall IC according to claim 1, wherein the non-linear conversion means establishes a curved relation between the magnetic field strength and the output voltage.

\* \* \* \* \*